United States Patent [19]
Arino

[11] Patent Number: 5,157,578
[45] Date of Patent: Oct. 20, 1992

[54] HYBRID PRINTED CIRCUIT BOARD

[75] Inventor: Tateo Arino, Kawaguchi, Japan

[73] Assignee: Kabushiki Kaisha Toshiba, Kanagawa, Japan

[21] Appl. No.: 853,860

[22] Filed: Mar. 20, 1992

Related U.S. Application Data

[63] Continuation of Ser. No. 602,939, Oct. 25, 1990, abandoned, which is a continuation of Ser. No. 226,241, Jul. 29, 1989, abandoned.

[30] Foreign Application Priority Data

Jul. 31, 1987 [JP] Japan ............................. 62-191663
Jan. 30, 1988 [JP] Japan ............................. 63-20621

[51] Int. Cl.$^5$ ............................................. H05K 1/14
[52] U.S. Cl. .................................. 361/412; 361/405; 361/413; 439/72; 439/74
[58] Field of Search ............... 174/52.4, 260; 439/68–70, 72, 74; 361/393–396, 400, 403–406, 410–412, 413

[56] References Cited

U.S. PATENT DOCUMENTS

| | | | |
|---|---|---|---|
| 2,695,963 | 11/1954 | Thias | 361/400 X |
| 2,850,681 | 9/1958 | Horton | 361/406 |
| 3,631,300 | 12/1971 | Humble | 361/428 |
| 3,646,246 | 2/1972 | Olney Jr. | 361/405 |
| 3,825,999 | 7/1974 | Rubey | 361/406 X |
| 3,859,722 | 1/1975 | Kinsky et al. | 361/400 X |
| 3,917,984 | 11/1975 | Kong. | |
| 4,012,723 | 3/1977 | Harper | 174/52.4 X |
| 4,220,303 | 9/1980 | Stoldt | 361/400 X |
| 4,250,536 | 2/1981 | Barringer | 361/413 |
| 4,598,307 | 7/1986 | Wakabayashi et al. | 174/52.4 X |
| 4,647,123 | 3/1987 | Chin | 361/413 |
| 4,656,442 | 4/1987 | Hayakawa | 361/395 |
| 4,683,550 | 7/1987 | Jindrick | 361/413 |
| 4,703,394 | 10/1987 | Petit | 361/413 |
| 4,780,795 | 10/1988 | Meinel | 174/52.4 X |

FOREIGN PATENT DOCUMENTS 31240 7/1981 European Pat. Off. .
1209158 10/1970 United Kingdom .

OTHER PUBLICATIONS

Insulated Circuits Inc., Carry-Through printed circuits, Engineering Bull., #106, Mar. 1954, 4 pps. copy in 361/406.

*Primary Examiner*—Gerald P. Tolin
*Attorney, Agent, or Firm*—Finnegan, Henderson, Farabow, Garrett and Dunner

[57] ABSTRACT

A hybrid printed circuit board that has at least one circuit device thereon and has leads mounted on at least one outside edge of the board. The hybrid printed circuit board also has a lead-free area within the lead disposing outside edge of the board that reduces the mounting space necessary for the board.

6 Claims, 6 Drawing Sheets

HYBRID PRINTED CIRCUIT BOARD

This application is a continuation of application Ser. No. 07/602,939 filed Oct. 25, 1990 now abandoned, which is a continuation of application Ser. No. 07/226,241 filed Jul. 29, 1988, abandoned.

The present application claims priority of Japanese patent application Nos. 62-191663 filed on Jul. 31, 1987 and 63-20621 filed on Jan. 30, 1988.

FIELD OF THE INVENTION

The present invention relates to a hybrid printed circuit board used, for example, in a PBX (Private Branch Exchange).

The PBX accommodates a lot of circuit boards respectively including circuits for interfacing with a terminal, such as a telephone. Commonly, one PBX accommodates as many as 50 boards, including 8 to 16 sets of interface circuits thereon. The accommodating form of these boards is like "accommodating books (printed boards) in a bookcase (PBX)". This means that the area and the thickness of a printed circuit board have a great effect on the size of PBX.

Accordingly, in a PBX system which requires a lot of printed circuit boards, the area of a printed circuit board has a great effect on the size of PBX. Heretofore, a technique has been well known for mounting a particular type of printed circuit board, which is referred to as a "hybrid printed circuit board". This board is constructed by electrically connecting a plurality of circuit devices on the board through leads. This means that the hybrid printed circuit board requires disposing a plurality of circuit devices in a predetermined space. Thus, if the area of the board is reduced, this results in a reduction of the size of the PBX system.

Yet, the hybrid printed circuit board generally requires more space than conventional printed circuit boards. Thus, miniaturization of a PBX system in which hybrid printed boards are used becomes difficult.

OBJECT AND SUMMARY OF THE INVENTION

An object of this invention is to miniaturize a system in which hybrid printed circuit boards are used.

A second object of this invention is to reduce space for mounting hybrid printed circuit boards in a PBX system.

A third object of this invention is to reduce the area of a hybrid printed circuit board.

A fourth object of this invention is to miniaturize the size of a hybrid printed circuit board.

A fifth object of this invention is to facilitate design of a hybrid printed circuit board.

In order to achieve these objects, the present invention provides a hybrid printed circuit board having circuit devices thereon and a plurality of leads mounted on at least one side thereof, and an area provided on the one side of the board free from the leads.

DETAILED DESCRIPTION OF THE PREFERRED EMBODIMENT

Hereinafter, the embodiment of this invention will be described.

Figure 1:
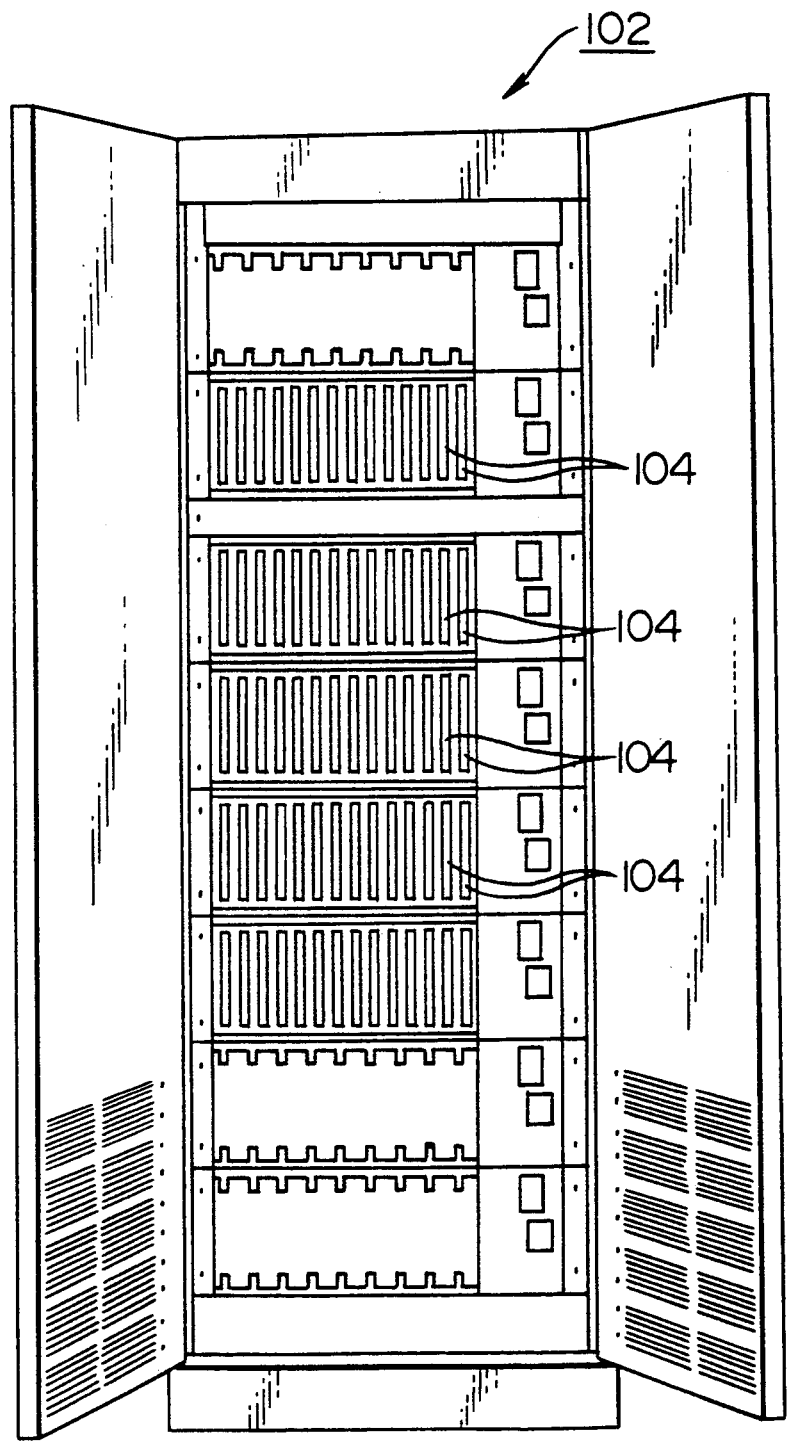
FIG. 1 is a view showing an outer appearance of a PBX employing a hybrid printed circuit board of this invention.

FIG. 1 is a view showing an outer appearance of a PBX employing a hybrid printed board of this invention.

PBX 102 shown in FIG. 1 accommodates about 70 printed boards 104 in a manner resembling the stacking of books in a bookcase. Each printed board 104 includes about 16 subscriber's circuits.

Figure 2:
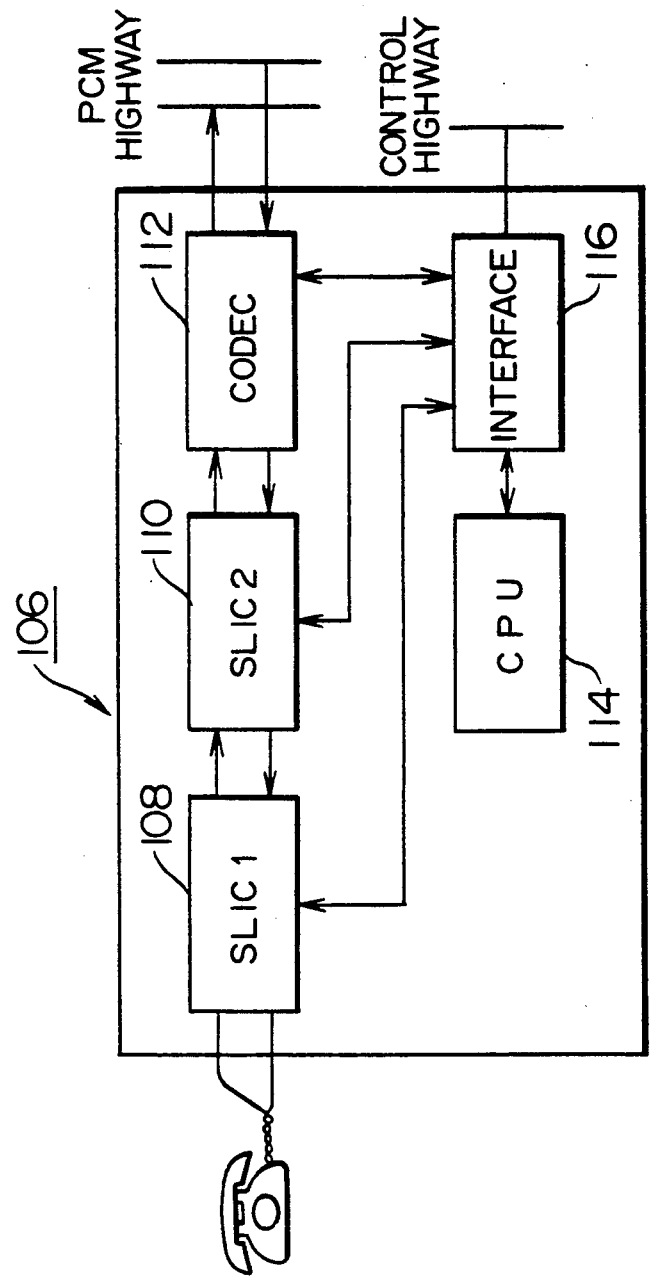
FIG. 2 is a block diagram for explaining an arrangement of a subscriber's circuit.

FIG. 2 is a block diagram for explaining the arrangement of such a subscriber's circuit.

The subscriber's circuit 106 shown in FIG. 2 is disposed between a PCM highway and a control highway conducting from the circuit of a digital system and a terminal machine, such as a telephone. This subscriber's circuit 106 is composed of a first subscriber's circuit 108 in charge of ring back tone control and test control, a second subscriber's circuit 110 in charge of power feed control, overvoltage protection, circuit monitor and 2/4 line conversion, a codec circuit 112 for converting a digital signal from the PCM highway into an analogue signal and an analogue signal supplied to the PCM highway into a digital signal, a CPU 114 for integrally controlling the subscriber's circuit 106 and an interface circuit 116 for interfacing these respective circuits to a control highway.

Figure 3:
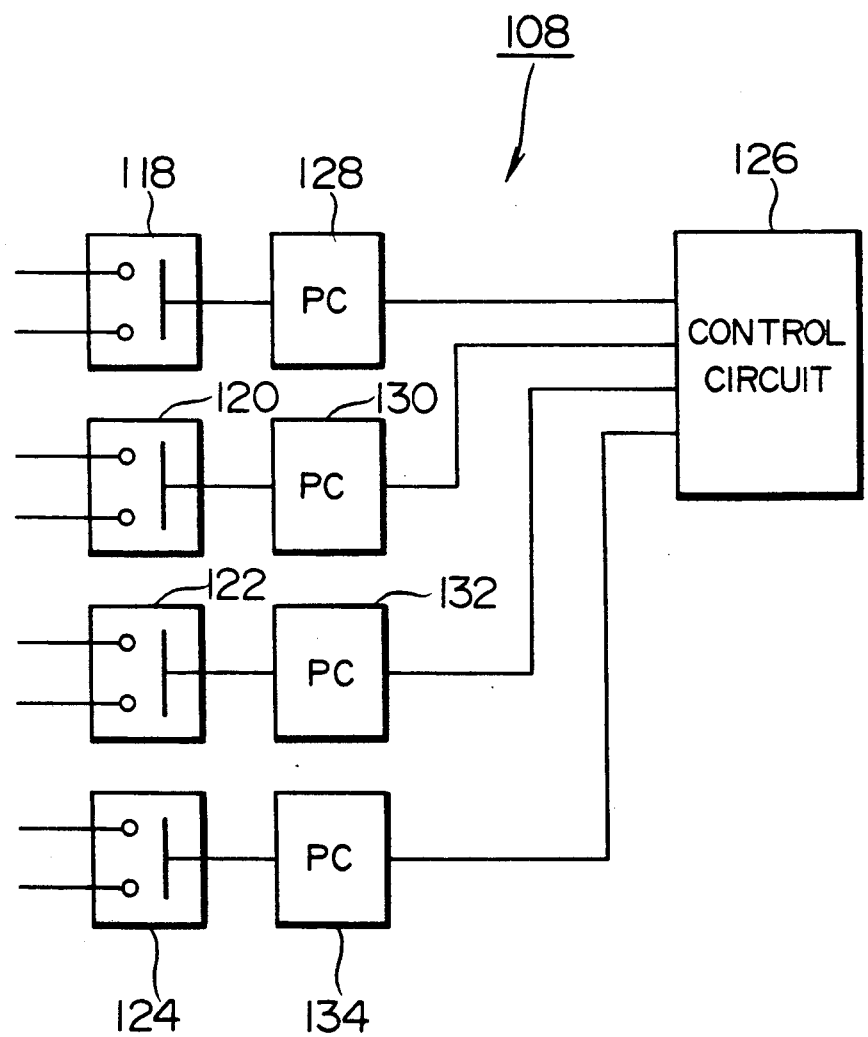
FIG. 3 is a block diagram for explaining arrangement of the first subscriber's circuit of FIG. 2.

FIG. 3 is a block diagram for explaining an arrangement of the first subscriber's circuit 108.

The first subscriber's circuit 108 shown in FIG. 3 is composed of four FET switches 118, 120, 122, 124 for various kinds of switching, a control circuit 126 for controlling each switching and photocouplers 128 to 134 laid between these FET switches and the control circuit.

Figure 4:
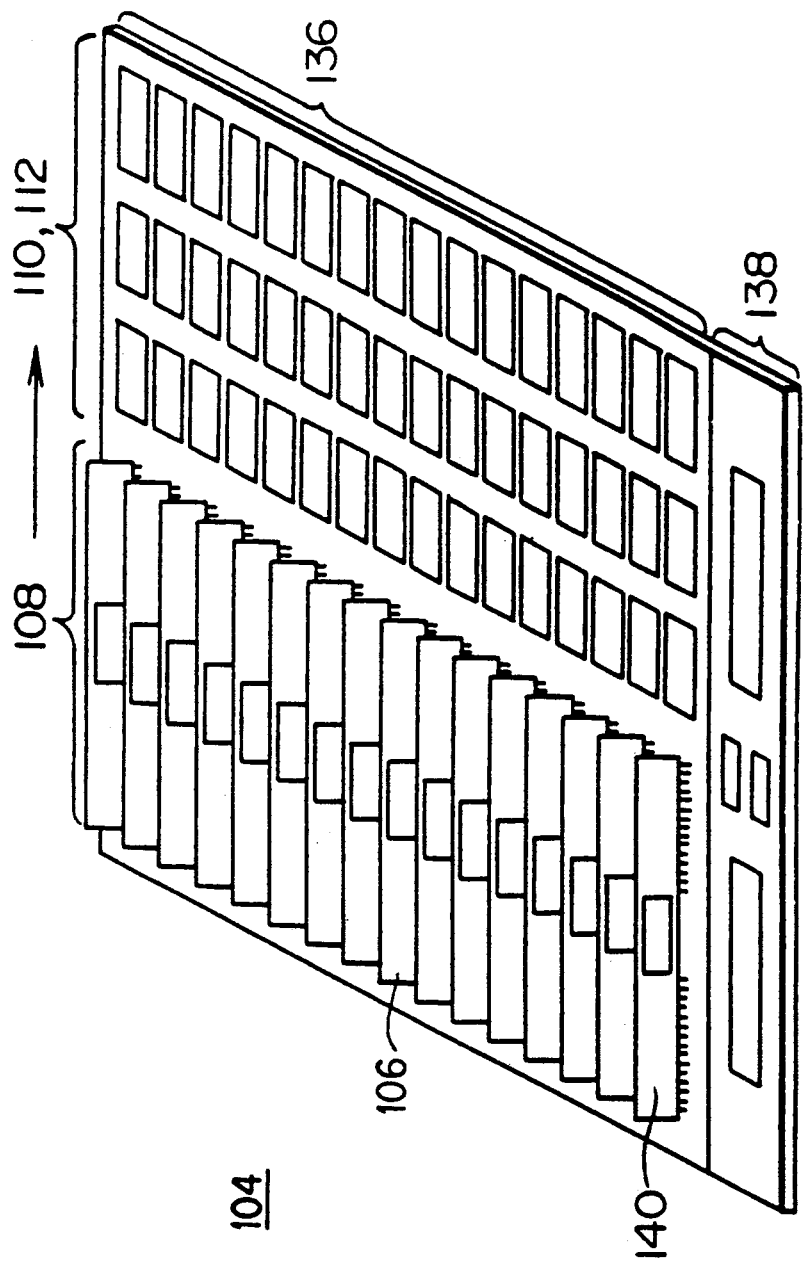
FIG. 4 is a perspective view of a printed board having a subscriber's circuit.

FIG. 4 is a perspective view showing a printed board 104 provided with such a subscriber's circuit 106 as described above.

The printed board 104 shown in FIG. 4 is composed of a subscriber's circuit area 136 having subscriber's circuits 106 and a control circuit area 138 having control circuits for controlling these subscriber's circuits 106.

The subscriber's circuit area 136 includes first subscriber's circuits 108 for respective subscriber's circuits, second subscriber's circuits 110 and codec circuits 112 along the direction of an arrow shown in this figure. The subscriber's circuits 106 of the above-mentioned circuits are formed on a hybrid printed circuit board 140.

Figure 5:
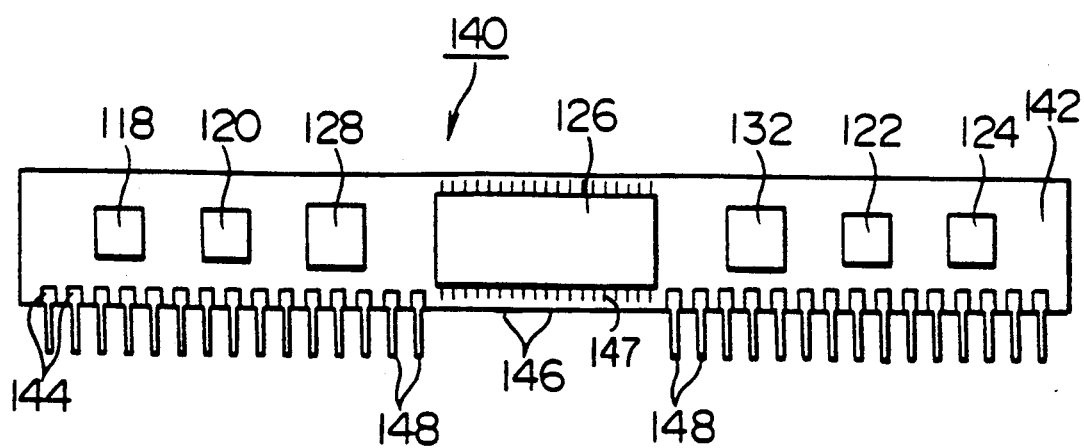
FIG. 5 is a plan view showing a hybrid printed circuit board of this invention.
Figure 6:
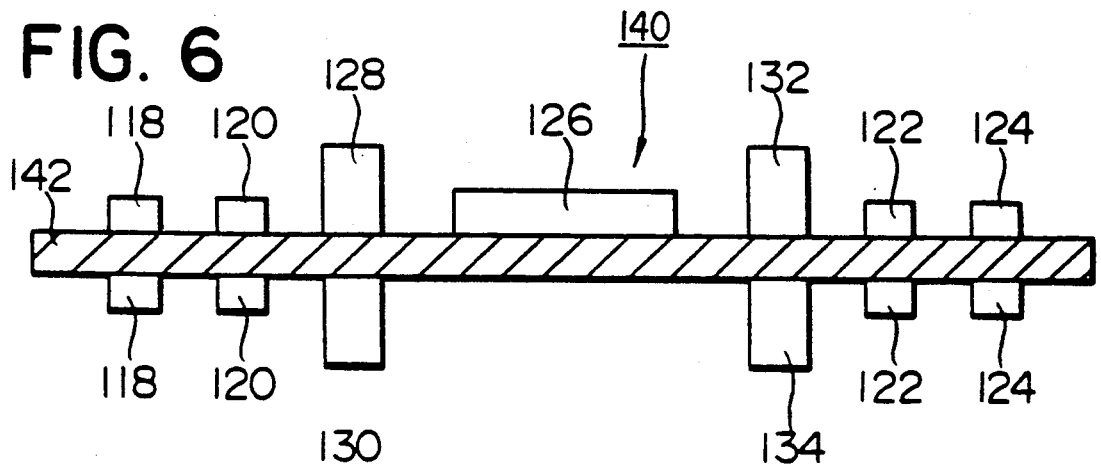
FIG. 6 is a longitudinal section showing a hybrid printed circuit board of this invention.

FIG. 5 is a plan view showing such a hybrid printed circuit board 140 and FIG. 6 is a longitudinal section showing the board 140.

The hybrid printed circuit board shown in these Figures is composed of FET switches 118 to 124, a control circuit 126 and photo couplers 128 to 134 formed on the printed board 142.

The printed board 142 typically is 11 mm in height and 90 mm in width. There is disposed on the lead-disposed area along one of the longer sides of the printed board 142 thirty pads 144 for lead connection that are respectively 2 mm is height and 1 mm in width. This longer side includes about 21 mm-long area in the center thereof which is assigned as a lead-free area 146 on which leads are not disposed. Thus, in this area no pad 144 is provided.

The control circuit 126, serving as the circuit device, is 10.5 mm in height and 19 mm in width and is disposed substantially near the center of the printed board 142. The control circuit 126 has second leads 147. The second leads 147 of the control circuit 126 are positioned near the lead-free area 146. The control circuit 126 is spaced from the pads 144 by about 1 mm. The control circuit 126 contains two FET switches and photocouplers formed on both sides thereof. These FET switches and photocouplers are respectively smaller than the control circuit in height and width.

Each pad 144 has a lead 148 for connecting with the printed board 104. The lead 148 is about 4.6 mm in length.

Figure 7:
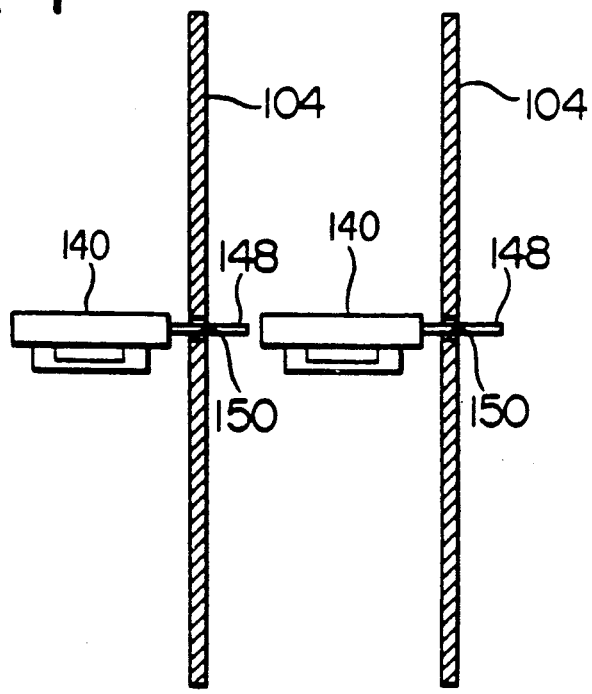
FIG. 7 is a view showing two neighboring printed boards of the PBX shown in FIG. 1.

FIG. 7 is a view showing two neighboring printed boards 104 of those boards shown in FIG. 1.

As shown in FIG. 7, the lead 148 projected on the printed board 104 is fixed by soldering through a through hole 150 provided in the printed board 104.

The lead 148 projected through the through hole 150 to the rear side is 2 mm in length, the hydrid printed circuit board 104 is 12 mm in height from the printed board 104 surface (including 1 mm lead length), the interval between the top of the lead 148 and the top of the hybrid printed circuit board 104 is 2 mm and the printed board is 1.6 mm in thickness. This means that the interval between the neighboring printed boards 104 is about 20 mm.

The provision of the lead-free area 146 results in an interval between the printed boards 104 which is as small as about 20 mm, as described above. If the leads 148 are disposed on the area corresponding to the lead-free area 146, the printed board 142 in the hybrid printed circuit board is about 15 mm in height on the basis of the fact that the control circuit 126 is 10.5 mm in height, the pad 144 is 2 mm in height and the gap between the control circuit 126 and the pad 144 is about 2 mm in height and the gap between the control circuit 126 and the pad 144 is about 2 mm. Thus, the printed board 142 to which this invention is applied is lower than the normal printed board by about 4 mm. One rack in the PBX shown in FIG. 1 accommodates fourteen printed boards 104, so that he width of the PBX 102 is made shorter by about 50 mm.

Furthermore, this embodiment forms the control circuit 126 substantially near center of the printed board 142, so that the wiring design of the hybrid printed circuit board 140 is facilitated and miniaturized, because the control circuit 126 includes the largest number of input and output pins among the cells loaded on the hybrid printed circuit board 140. Thus, if this control circuit 126 is located in the center of the printed board 142, allowance for design is guaranteed and the inner layers of the printed board 142 are reduced in number.

Moreover, due to provision of the lead-free area 146, this embodiment allows wiring patterns to be provided on the surface of the printed board 104 under the lead-free area 146. Thus, it is possible to guarantee allowance for design of the printed board 104 employing the hybrid printed circuit board 140.

Figure 8:
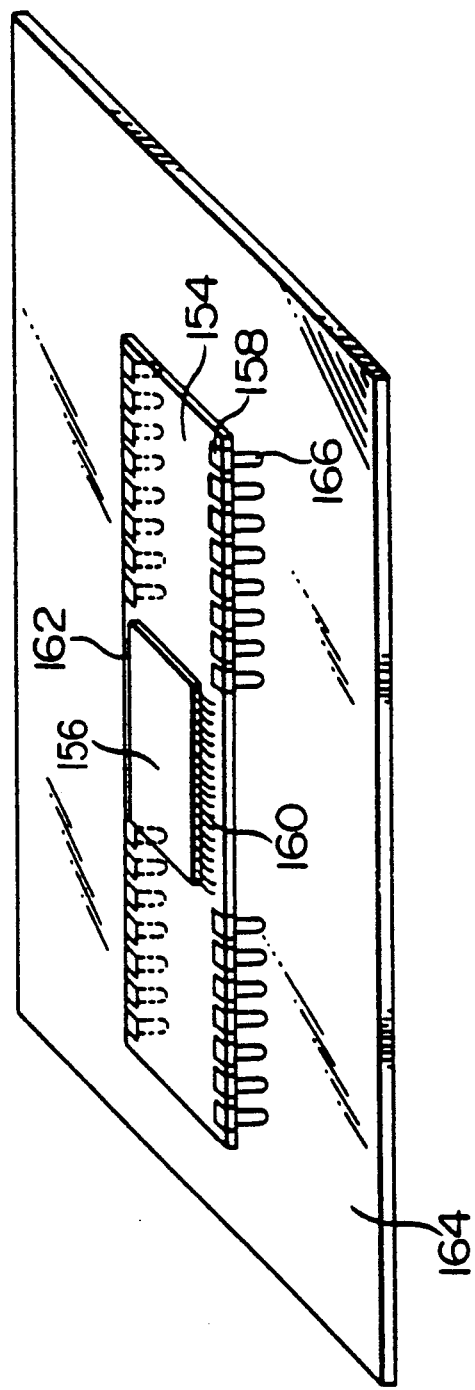
FIG. 8 is a perspective view showing a hybrid printed circuit board of the second embodiment and another printed board for mounting this hybrid printed circuit board thereon.

FIG. 8 is a perspective view showing a printed board on which the hybrid printed circuit board of the second embodiment is mounted.

The hybrid printed circuit board 154 shown in this figure is composed of a control circuit 156, FET switches (not shown) and photo couplers (not shown) formed on a printed board 154.

The printed board 154 is 67 mm in length and 12.5 mm in width. Each longer side of this printed board 154 contain 15 pads for lead connections disposed thereon, that are respectively 2 mm in length and 1 mm in width. The 21 mm long areas in the centers of the longer sides are assigned as lead-free areas. Thus, in this area no pads 158 are provided.

The control circuit 156 is 10.5 mm in length and 19 mm in width and is formed substantially near the center of the printed board 154. Thus, the control circuit 156 includes the portions positioned in the lead-free areas 160, 162. The control circuit 156 is spaced from the pad 158 by about 1 mm. The control circuit 156 is spaced from the pad 158 by about photocouplers formed on each side. These FET switches and photocouplers are smaller than the control circuit in width and height.

Each pad 158 has a lead 166 for connecting with the printed board 164, that is formed perpendicularly. This means that this hybrid printed circuit board 154 is disposed in parallel with the printed board 164.

This embodiment has a reduced width of the hybrid printed circuit board 154, resulting in reduction of the width of the printed board 164 employing this hybrid printed circuit board 154.

Further, like the first one, this embodiment contributes to facilitating and simplifying wiring design of the hybrid printed board circuit 154 and reducing the pattern size and guarantees allowance for design of the printed board 164 employing the hybrid printed board 154.

Heretofore, this invention has been described with reference to the embodiments, but, this invention is not limited to these embodiments and can be modified in many ways without departing from the spirit of this invention.

What is claimed is:

1. A circuit board assembly comprising:

A flat circuit board having conductors, two first long sides, two first short sides, a first thickness, a first upper surface, and a plurality of first leads, the flat circuit board having a first lead-disposed area on the first upper surface at the edge of only one of the first long sides, the first leads being disposed at intervals in the first lead-disposed area in parallel with the upper surface, the flat circuit board having at least two first contiguous lead-free areas on the first upper surface at opposite edges of both first long sides, the conductors being disposed on the first contiguous lead-free areas and the first leads not being disposed in the first lead-free areas;

at least one flat circuit device having two second long sides, two second short sides which are shorter than the first short sides, a second thickness, a second upper surface and second leads disposed at intervals on the second upper surface at the edges of both second long sides, the second leads respectively being connected to the conductors of the flat circuit board at the two first contiguous lead-free areas such that the second long sides are parallel to the first long sides and predetermined sections of the at least one flat circuit device are mounted on both first contiguous lead-free areas; and a main board whereby the first leads of a plurality of the flat circuit boards are connected to the main board so as to be perpendicular to the main board, and a plurality of the flat circuit boards are perpendicularly mounted on the main board.

2. The circuit board assembly according to claim 1, wherein the number of the flat circuit device is one.

3. The circuit board assembly according to claim 1, wherein the flat circuit device is disposed in the center of the flat circuit board.

4. A hybrid circuit board comprising:

A flat circuit board having conductors, two first long sides, two first short sides, a first thickness, a first upper surface, and a plurality of first leads, the flat circuit board having a first lead-disposed area on the first upper surface at the edge of only one of the first long sides, the first leads being disposed at intervals in the first lead-disposed area in parallel with the upper surface, the flat circuit board having at least two first contiguous lead-free areas on the first upper surface at opposite edges of both first long sides, the conductors being disposed on the first contiguous lead-free areas and the first leads not being disposed in the first lead-free areas; and at least one flat circuit device having two second long sides, two second short sides which are shorter than the first short sides, a second thickness, a second upper surface and second leads disposed at intervals on the second upper surface at the edges of both second long sides, the second leads respectively being connected to the conductors of the flat circuit board at the two first contiguous lead-free areas such that the second long sides are parallel to the first long sides and predetermined sections of the at least one flat circuit device are mounted on both first contiguous lead-free areas.

5. The hybrid circuit board according to claim 4, wherein the number of the flat circuit device is one.

6. The hybrid circuit board according to claim 4, wherein the flat circuit device is disposed in the center of the flat circuit board.

* * * * *